(12) United States Patent
Lao et al.

(10) Patent No.: US 8,310,310 B2
(45) Date of Patent: Nov. 13, 2012

(54) BURST MODE AMPLIFIER (75) Inventors: Zhihao Lao, Camarillo, CA (US); Hehong Zou, Westlake Village, CA (US)

(73) Assignee: Gtran Inc., Camarillo, CA (US)

( * ) Notice: Subject to any disclaimer, the term of this patent is extended or adjusted under 35 U.S.C. 154(b) by 0 days.

(21) Appl. No.: 13/041,180

(22) Filed: Mar. 4, 2011

(65) Prior Publication Data

US 2011/0215870 A1    Sep. 8, 2011

Related U.S. Application Data (60) Provisional application No. 61/339,428, filed on Mar. 5, 2010.

(51) Int. Cl.
*H03F 3/45* (2006.01)
(52) U.S. Cl. .......................... 330/260; 330/294
(58) Field of Classification Search .................. 330/98, 330/252, 260, 261, 294
See application file for complete search history.

(56) References Cited

U.S. PATENT DOCUMENTS

| | | | | |
|---|---|---|---|---|
| 5,283,483 A | * | 2/1994 | Laber et al. | 327/552 |
| 5,994,966 A | * | 11/1999 | Stikvoort | 330/306 |
| 6,114,913 A | | 9/2000 | Entrikin | |
| 6,160,435 A | * | 12/2000 | Kim | 327/336 |
| 6,724,158 B1 | | 4/2004 | Feldman | |
| 7,498,792 B2 | * | 3/2009 | Chang et al. | 323/288 |
| 2003/0218508 A1 | | 11/2003 | Chiou et al. | |
| 2003/0219260 A1 | | 11/2003 | Chiou et al. | |
| 2005/0052246 A1 | | 3/2005 | Visocchi | |

* cited by examiner

*Primary Examiner* — Henry Choe
(74) *Attorney, Agent, or Firm* — GSS Law Group (57) ABSTRACT

An integrator circuit cancels a DC offset component related to an average DC value of a burst mode input signal from the output of an amplifier. The integrator circuit outputs an average DC value of the input signal in a response time that is shorter than the preamble of a burst mode signal. The integrator output signal remains stable within selected amplitude limits for a length of time corresponding to the data portion of a burst mode signal. A transimpedance amplifier embodiment of the invention comprises a TIA gain stage, an integrator, and a voltage-controlled current course. Other embodiments comprise an amplifier for converting single-ended input signals to differential output signals, an amplifier for differential output offset cancellation, a monolithic semiconductor integrated circuit die, and a packaged semiconductor integrated circuit device.

10 Claims, 7 Drawing Sheets

BURST MODE AMPLIFIER

CROSS REFERENCE TO RELATED APPLICATIONS

This application claims the benefit of U.S. Provisional Application No. 61/339,428 filed Mar. 5, 2010 and incorporated herein by reference in its entirety.

FIELD OF THE INVENTION

Embodiments of the invention relate generally to amplifier circuits, and more particularly to transimpedance amplifier (TIA) circuits in optical receivers for fiber optic communications networks.

BACKGROUND

In a passive optical network, pulsed optical signals may be transmitted over a single optical fiber between one or more end units and a center servo unit. Each end unit may include a receiver and a transmitter able to operate in continuous mode, where continuous mode refers to transmission or reception of a continuous stream of pulses. The center servo unit may include a receiver and a transmitter using time division multiplexing to send and receive pulses in burst mode from each end unit, where burst mode refers to a group of pulses received within a specified time window.

The center servo unit may receive pulses in a nearly continuous stream comprising many bursts. However, pulses in a burst from one end unit may be transmitted with different amplitude than pulses in a burst from another end unit. There may be a substantial time gap between one burst and the next burst. A burst may include a pathological pattern, that is, a pattern having many pulses representative of one logic state and only a few pulses representative of another logic state. Some bursts representative of video signals, for example, may include pathological patterns.

Within each burst, there may be an initial time interval referred to as a "preamble" allocated to a sequence of training pulses and a subsequent time interval containing pulses representative of data. Pulses in a preamble are used by a receiver to set detection thresholds for distinguishing between pulses representative of a digital bit value, for example a bit value of "1", from pulses representative of another digital bit value, for example a bit value of "0", and to distinguish between adjacent bit values. It is preferred that a settling time for a receiver's response after the start of a new burst should be less than the time duration of the preamble portion of the burst. A receiver that takes longer to settle than the time duration of a burst's preamble may recover data incorrectly from the burst.

A group of pulses has an associated average DC (direct current) value related to an average of the individual amplitudes of the pulses within the group. The average DC value may be expressed as a voltage, a current, or as digital data. The average DC value may be used by a receiver to recover data from bursts transmitted through a fiber optic network. Because of differences between bursts as previously explained, a receiver may determine a new average DC value for each received burst.

Circuits referred to as integrators are used by some receivers for determining an average DC value for a group of pulses. In one configuration, an integrator is placed in a feedback path from an output to an input of a transconductance amplifier (TIA) to determine the average DC value for an input signal received by the TIA from a photodetector. This arrangement comprises a DC control loop operating to cancel the average DC value from the TIA output signal. A response time for an integrator may be related to a value referred to as an RC time constant, calculated as a product of value of resistance at an integrator input and a value of capacitance in a feedback path from an integrator input to an integrator output. The time for an integrator to determine an average DC value associated with a burst, referred to herein as a response time, is preferably less than the time duration of the preamble of the burst. The average DC value determined by an integrator preferably remains stable for the duration of the data portion of a burst to facilitate data recovery from the burst.

An integrator having an output response governed by a single RC time constant, referred to herein as an RC-based integrator, may be designed to output an accurate, stable DC signal corresponding to an average DC value of a signal comprising a continuous stream of equal-amplitude pulses. An RC-based integrator may prevent a DC offset present in an input to a TIA from contributing to the output response of the TIA for such an input signal. However, an RC-based integrator time constant value selected for determining an average DC value for a burst mode pulse signal may produce poor results. For example, an RC-based integrator having a low-frequency cutoff of 100 kHz, where the RC time constant for the integrator determines the cut-off frequency, could have a time constant of 1.59 μS. A DC control loop using an RC-based integrator with a time constant of 1.59 μS will settle within 7 μS a longer time duration than the duration of a "preamble" portion of a burst mode signal in conventional fiber optic communications systems. If, for example, the RC-based integrator in a receiver is to settle within a time duration of 350 nS, the corresponding RC-based integrator low-frequency cutoff would be 2 MHz, a relatively high value which may result in undesirably high jitter after the control loop settles. High jitter may lead to data recovery errors and other problems in fiber optic communications systems.

Designing an integrator operating with a single time constant for use with burst mode signals may lead to conflicting design requirements. The response time of the integrator is preferably within the preamble time of the burst, yet the integrator should preferably hold a DC output stable for the entire duration of the burst. Because the data portion of a burst signal may be much longer than the preamble portion, an integrator RC time constant selected to give a response time within the time duration of the preamble may not give an integrator output which is stable over the duration of the data portion of the burst, and may cause problems with for the TIA such as excessive jitter and sensitivity. Conversely, an RC time constant selected to maintain stable integrator output over the time duration of the data portion of a burst may be too large to permit an integrator to fully determine the correct average DC value during the preamble portion of the burst. Receivers having integrators operating with single time constants may therefore produce errors in digital data reconstructed from burst signals input to the receiver.

SUMMARY

Embodiments of the invention comprise an integrator for removing direct current (DC) offset voltage corresponding to an average DC value of an input signal from an output from an amplifier. An integrator embodiment of the invention comprises an operational amplifier having two inputs and two outputs, with a first capacitor connected from one of the operational amplifier inputs to one of the operational amplifier outputs and a second capacitor connected from a second operational amplifier input to a second operational amplifier output. The integrator further includes a first transistor having an emitter connected to the first operational amplifier input and to the first capacitor and a second transistor having an emitter connected to the second operational amplifier input and to the second capacitor. An isolation resistor may optionally be connected to the base of each transistor.

A TIA embodiment of the invention comprises a DC control loop with the integrator connected in a feedback loop from an output of a TIA stage to an input of the TIA stage. The TIA embodiment of the invention further comprises a voltage-controlled current source having a control line connected to an integrator output and an offset current line connected to an input of the TIA stage. In another embodiment of the invention, an amplifier for converting single-ended input signals to differential output signals comprises an output of the integrator connected to an input of a first differential amplifier and integrator inputs connected to outputs of a second differential input amplifier. Differential outputs of the first differential amplifier are connected to differential inputs of the second differential amplifier. In yet another embodiment of the invention, an amplifier for differential output offset cancellation includes the integrator having a first output connected to an input of a first differential amplifier, a second integrator output connected to another input of the first differential amplifier, and integrator inputs connected to outputs of a second differential input amplifier.

Other embodiments of the invention include a monolithic semiconductor integrated circuit provided either as a die or as a packaged device including the die.

This section summarizes some features of the present invention. These and other features, aspects, and advantages of the embodiments of the invention will become better understood with regard to the following description and upon reference to the following drawings, wherein:

DESCRIPTION

Embodiments of the invention include an integrator circuit for determining an average DC value for a burst mode signal. The integrator circuit outputs a signal which accurately represents the magnitude of the average DC value of a burst mode signal in a response time that is less than the time duration of a preamble portion of the burst. The integrator output signal remains stable within selected limits for a length of time corresponding to the time duration of a data portion of a burst mode signal. Embodiments of the invention are effective for cancelling amplifier output offsets from electrical signals produced by conversion of burst mode optical signals transmitted over a fiber optic network.

Some embodiments of the invention comprise an integrator connected in a feedback loop with a TIA so as to cancel output offset from the TIA. Other embodiments of the invention are effective for cancelling output offset from a limiting amplifier in a fiber optic receiver including a TIA. Some embodiments of the invention are adapted for cancelling output offset in circuits having single-ended inputs and differential outputs. Other embodiments of the invention are adapting for cancelling output offset in circuits having differential inputs and differential outputs. Some advantages offered by the embodiments of the invention disclosed herein include, but are not limited to, reduction of data recovery errors from signals transmitted over fiber optic networks, smaller die size compared to prior-art RC-based integrators, and location of all components required for control of integrator response time on a single monolithic semiconductor wafer which may be economically produced in convention CMOS and BiCMOS integrated circuit fabrication processes.

Unless otherwise indicated, two components referred to herein as "connected" are electrically connected, and a "connection" refers to an electrical connection. A time constant refers to a parameter which may be used to predict a response of a system to a time-varying input to the system. An RC time constant is a property of a system comprising an electrical circuit. A method for determining a value of an RC time constant may include multiplying a selected value of electrical resistance by a selected value of electrical capacitance, but other methods will be known to one familiar with responses of electrical circuits to time-varying signals. A response time of a circuit refers herein to a time duration for a signal to change from an initial value to a selected value. A response time may alternatively be referred to as a sample time for an integrator. A hold time refers to a duration of time over which a signal's amplitude remains within a range defined by a selected upper limit and a selected lower limit. A signal is referred to herein as stable when its amplitude remains within a range defined by a selected upper limit and a selected lower limit for a selected duration of time.

Figure 1:
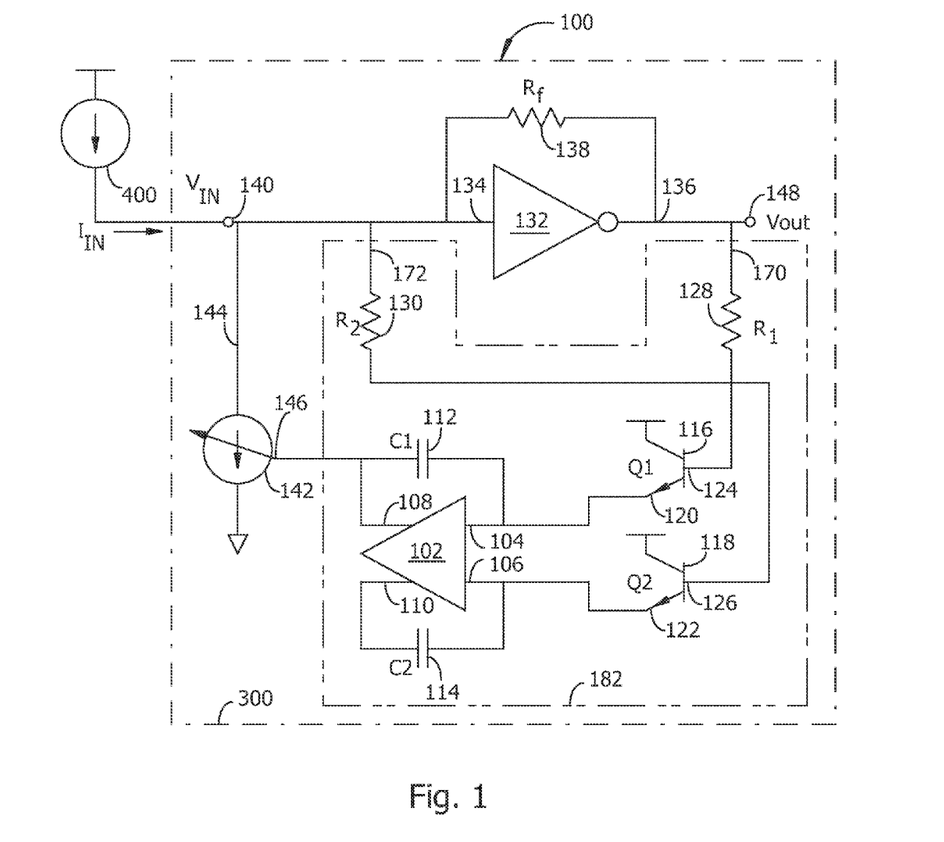
FIG. 1 is a schematic diagram of an example of a fast settling burst mode amplifier embodiment of the invention comprising a TIA stage with a DC control loop including an integrator embodiment of the invention.

Referring now to the figures, an example of a fast settling burst mode amplifier embodiment of the invention is shown in the schematic diagram of FIG. 1. The embodiment of the invention 100 of FIG. 1 includes an integrator circuit 182 comprising an operational amplifier 102 having a first capacitor C1 112 connected from a first operational amplifier input 104 to a first operational amplifier output 108. A second capacitor C2 114 is connected from a second operational amplifier input 106 to a second operational amplifier output 110. Capacitors C1 112 and C2 114 may both have a same value of capacitance or may alternately have different values of capacitance.

Continuing with FIG. 1, the integrator 182 further includes a first transistor Q1 116 having an emitter 120 connected to the first operational amplifier input 104. A second transistor Q2 118 has an emitter 122 connected to the second operational amplifier input 106. The base 124 of transistor Q1 116 is connected to a first isolation resistor R1 128 and thence to a first control loop input line 170. The base 126 of transistor Q2 118 is connected to a second isolation resistor R2 130 and thence to a second control loop input line 172. Alternatively, the isolation resistors R1 128 and R2 130 may be omitted, the base 124 of Q1 116 connected directly to the first control loop input line 170, and the base 126 of Q2 118 connected directly to the second control loop input line 172.

As shown in FIG. 1, a fast settling burst mode amplifier embodiment of the invention 100 may optionally include a TIA stage 132. A feedback resistor $R_f$ 138 is connected from a TIA stage output 136 to a TIA stage input 134. In the example of FIG. 1, the first control loop input connection 170 is connected to the TIA stage output 136, and the second control loop input connection 172 is connected to the TIA stage input 134. An output connection 148 is connected to the first control loop input connection 170 and to the TIA stage output connection 136. The TIA stage input 134 is further connected to a current input terminal 140. In the example of FIG. 1, an input current $I_{IN}$ may be input at voltage $V_{IN}$ to the current input terminal 140 from a photodetector 400. The photodetector 400 is an external component that is not a part of an embodiment of the invention.

An embodiment of the invention 100 having an optional TIA stage 132 as shown in FIG. 1 may further optionally include a voltage controlled current source 142 (VCCS) for producing a current proportional to a magnitude of voltage applied to a VCCS control input 146. The operational amplifier first output line 108 is connected to the VCCS control input 146. During operation of the circuit embodiment of FIG. 1, the current flowing through VCCS 142 on an offset line 144 connected to the current input terminal 140 and to the TIA stage input 134 will be equal in magnitude and opposite in polarity to an average DC value of a pulsed current signal input to current input terminal 140.

Embodiments of the invention 100 are well suited for fabrication on a single, monolithic integrated circuit die. A boundary line 300 in FIG. 1 is representative of a die fabricated in accord with an embodiment of the invention. Some embodiments of the invention are fabricated on a single die in a CMOS semiconductor manufacturing process. Other embodiments of the invention are fabricated on a single die in a BiCMOS semiconductor manufacturing process.

Figure 2:
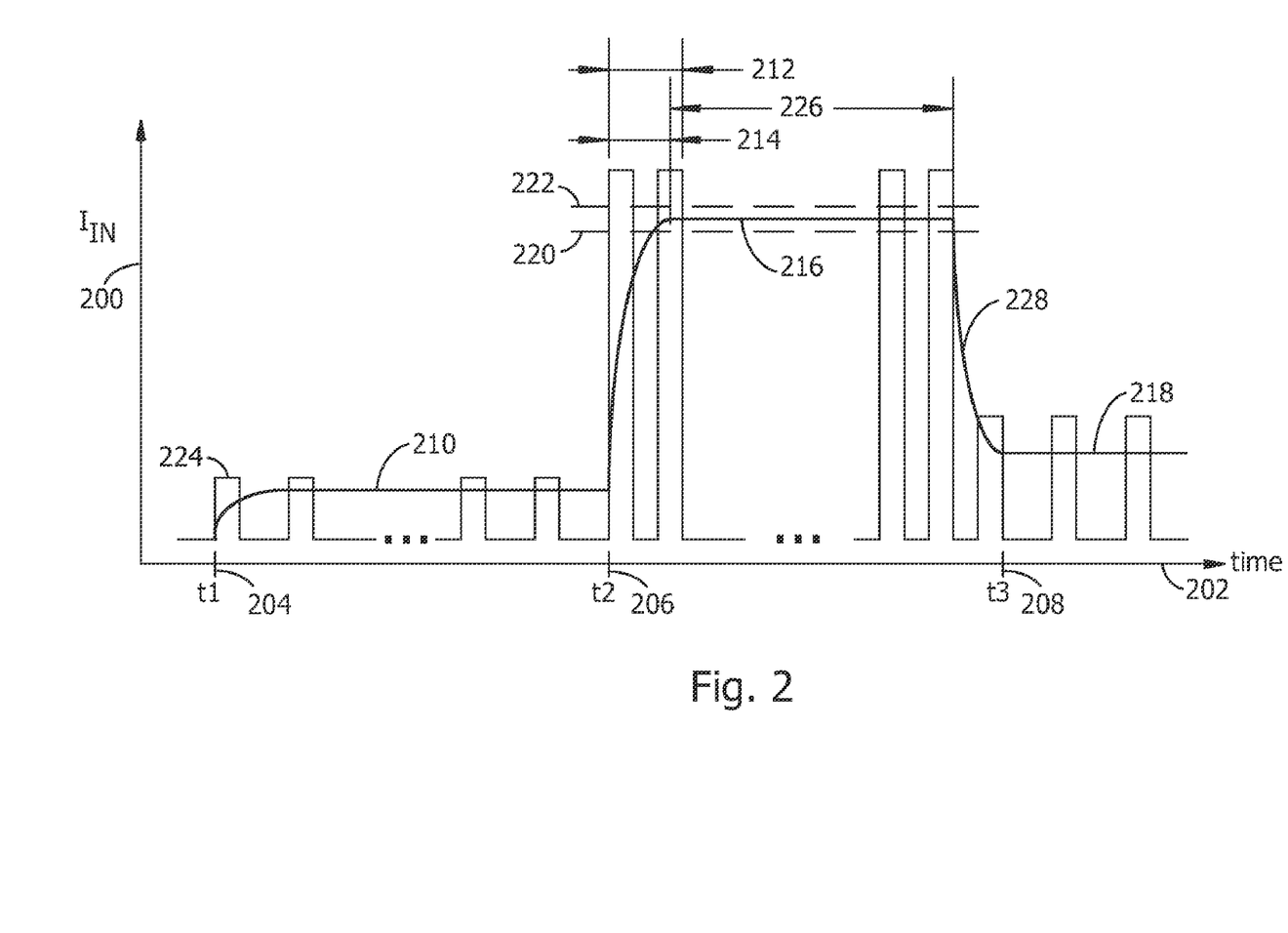
FIG. 2 is a graph of an example of a burst mode signal comprising more than one burst, each burst comprising a group of pulses within a selected time window.

The graph of FIG. 2 may be used in conjunction with the schematic of FIG. 1 to illustrate operation of the embodiments of the invention 100. The vertical axis 200 in FIG. 2 represents $I_{IN}$. The horizontal axis 202 represents time. A burst mode signal 224 extends from time t1 204 past time t3 208. A time interval t1 204 to t2 206 defines a duration of a first burst. A time interval t2 206 to t3 208 defines a duration of a second burst having pulse amplitudes which differ from the amplitudes of pulses in the first burst and third burst. In the example of FIG. 2, the time durations of the first and second bursts are equal.

As shown for the second burst in FIG. 2, each burst includes a preamble portion 212 and a data portion 226. A curved line 228 represents current flowing through VCCS 142 and further represents the time domain response of output from operational amplifier 102 on first output 108, corresponding to an output response of the integrator 182. A response time 214 is shown in FIG. 2 as a time to change from a previous, stable output of the integrator 182 to a new, stable output that remains with a range specified by an upper limit 222 and a lower limit 220. In the example illustrated, an average DC value 210 for the first burst differs in amplitude from the average DC value 216 for the second burst and from the average DC value 218 for a third burst (full duration of third burst not shown), and the transition from a first average DC value 210 to a next average DC value 216 occurs in a response time 214 that is less than the time duration of the preamble portion 212 of the second burst. Burst mode amplifier embodiments of the invention are referred to as "fast settling" because they settle within the preamble time, that is, they produce stable output in a time duration that is less than the preamble portion of a burst.

At time t2 206 in FIG. 2, burst mode signal 224 may be seen to change from a relatively small pulse amplitude for the first burst to a larger pulse amplitude for the second burst. The change represents a step increase in $I_{IN}$ applied to current input terminal 140 in FIG. 1. Transistor Q2 118 detects the change in peak amplitude and creates an imbalance at the inputs 104, 106 of the operational amplifier 102, causing a corresponding imbalance in the operational amplifier outputs 108, 110 and causing capacitor C1 112 to charge and C2 114 to discharge. The output voltage on the first operational amplifier output 108 increases, causing an increase in the current flowing through VCCS 142 on the offset control line 144. The rise time of the current flowing through VCCS 142 is given by Iop/C1, where Iop is the DC current from the output stage of the operational amplifier 102, and C1 is the value of capacitance for C1 112. In this example, transistor Q1 116 does not turn on. The higher the magnitude of Iop, the faster the response time. As the output voltage on line 108 rises, transistor Q2 118 turns off, resulting in a time constant for the integrator during the data portion 226 of the burst, also referred to as the hold time 226 for the integrator, of 1/(Roff/C1). Roff may be a very large number, at least several MΩ, because it is related to the DC leakage current into the inputs of the operational amplifier. The relatively large values for Roff in embodiments of the invention may be fabricated with small structures (transistors and small capacitor values) that are much more easily and economically produced in CMOS and BiCMOS processes than comparable resistance and capacitance values used in RC-based integrators.

For a transition from a burst with a large pulse amplitude to a burst with a small pulse amplitude, as may be seen at time t3 208 in FIG. 2, transistor Q1 116 senses the change in peak amplitude and creates an imbalance at the inputs to the operational amplifier 102, with subsequent operation as described above. In this example, transistor Q2 118 does not turn on.

Figure 3:
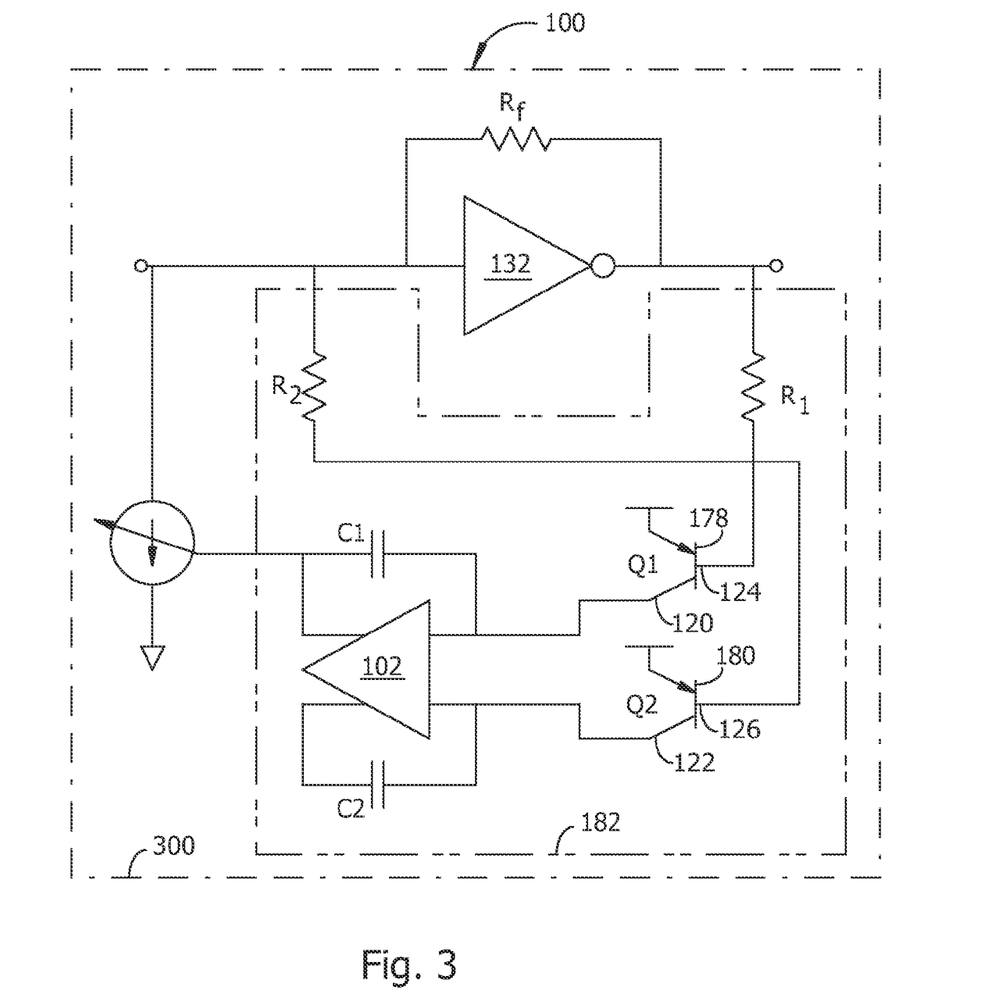
FIG. 3 is a schematic diagram of an alternative embodiment of the invention in which the NPN transistors of FIG. 1 have been replaced with PNP transistors.

In another embodiment of the invention, the NPN resistors of FIG. 2 may be replaced with PNP transistors. FIG. 3 shows an example of a TIA DC control loop with transistor Q1 116 and transistor Q2 118 from FIG. 1 replaced with PNP transistors Q1 178 and Q2 180.

Figure 4:
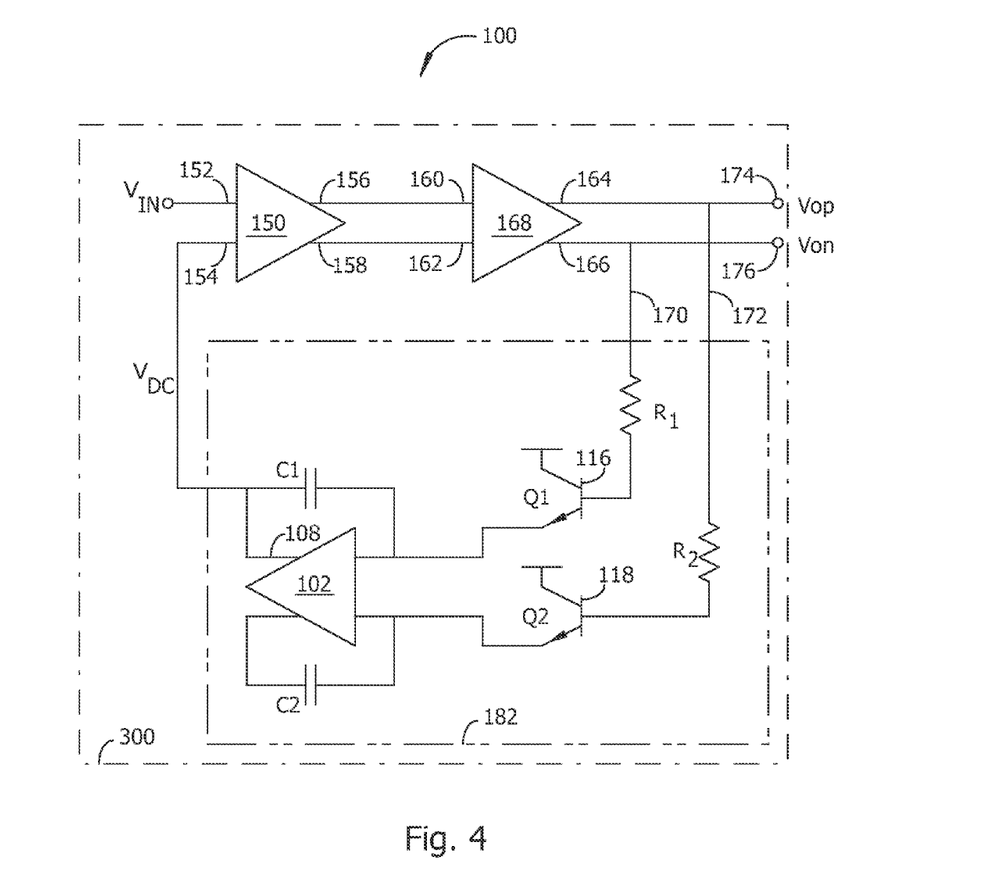
FIG. 4 is a schematic diagram of single-ended to differential converter embodiment of the invention in which an integrator removes a DC component from an input signal and converts a single-ended input signal to a differential output signal.
Figure 5:
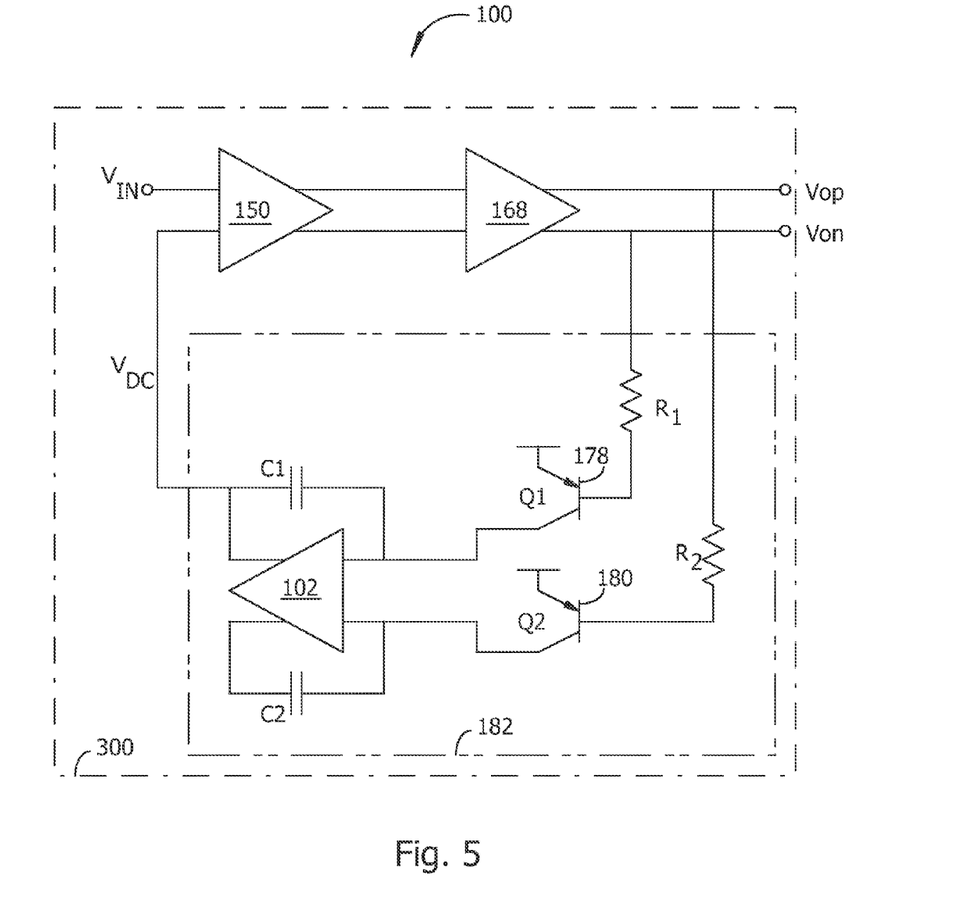
FIG. 5 is a schematic diagram for an alternative embodiment of the invention in which the NPN transistors of FIG. 4 have been replaced with PNP transistors.

An integrator in accord with an embodiment of the invention may be combined with one or more amplifiers to convert a single-ended signal to a differential signal, as shown in FIG. 4. In FIG. 4, a first amplifier 150 having a first differential output 156 is connected to a first differential input 160 on a second amplifier 168. A second differential output 158 of the first amplifier 150 is connected to a second differential input 162 on the second amplifier 168. Although two amplifiers 150, 168 are shown in FIG. 4, in other embodiments more than two amplifiers are connected together in similar fashion. A first output 164 of the second amplifier 168 is connected to the second control loop input 172 of the integrator 182. A second output 166 of the second amplifier 168 is connected to the first control loop input 170 of the integrator 182. The output line 108 is connected to a first input 154 of the first amplifier 150. When a single-ended input voltage $V_{IN}$ is applied to a second input 152 of the first amplifier 150, a differential output signal with DC offset canceled will be presented across terminals Vop 174 and Von 176. FIG. 5 represents an alternative embodiment of the invention in which the NPN resistors Q1 116 and Q2 118 of FIG. 4 have been replaced with PNP transistor Q1 178 and PNP transistor Q2 180.

Figure 6:
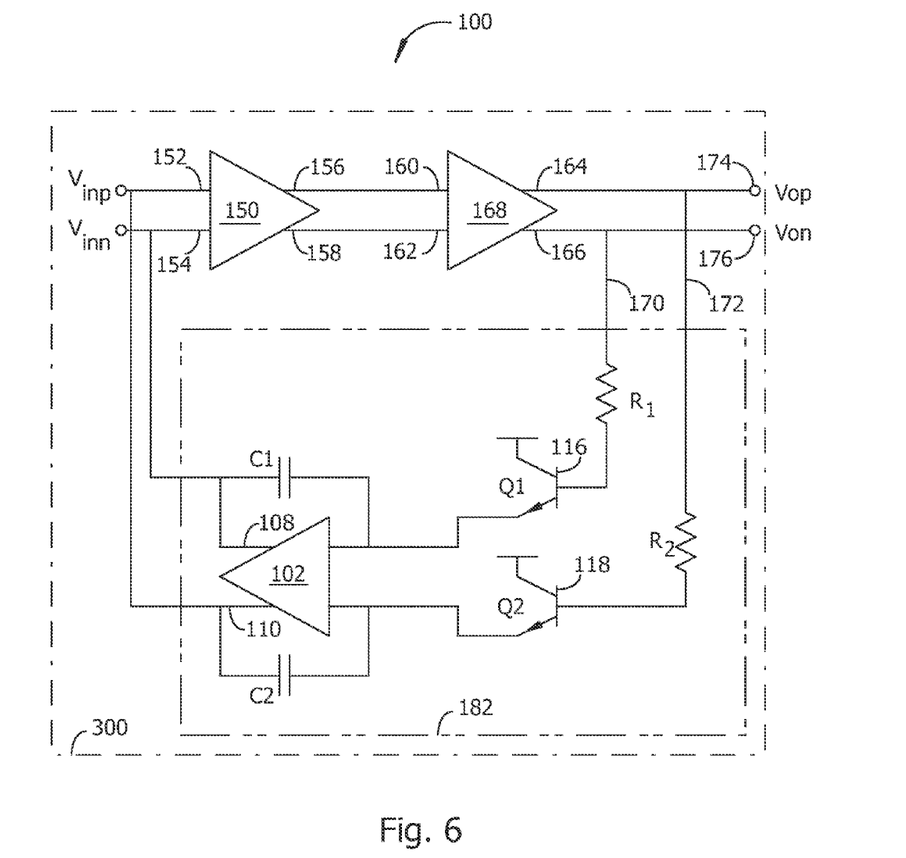
FIG. 6 is a schematic diagram of an embodiment of the invention for cancelling an average DC value in a signal received by an amplifier having differential inputs and differential outputs.
Figure 7:
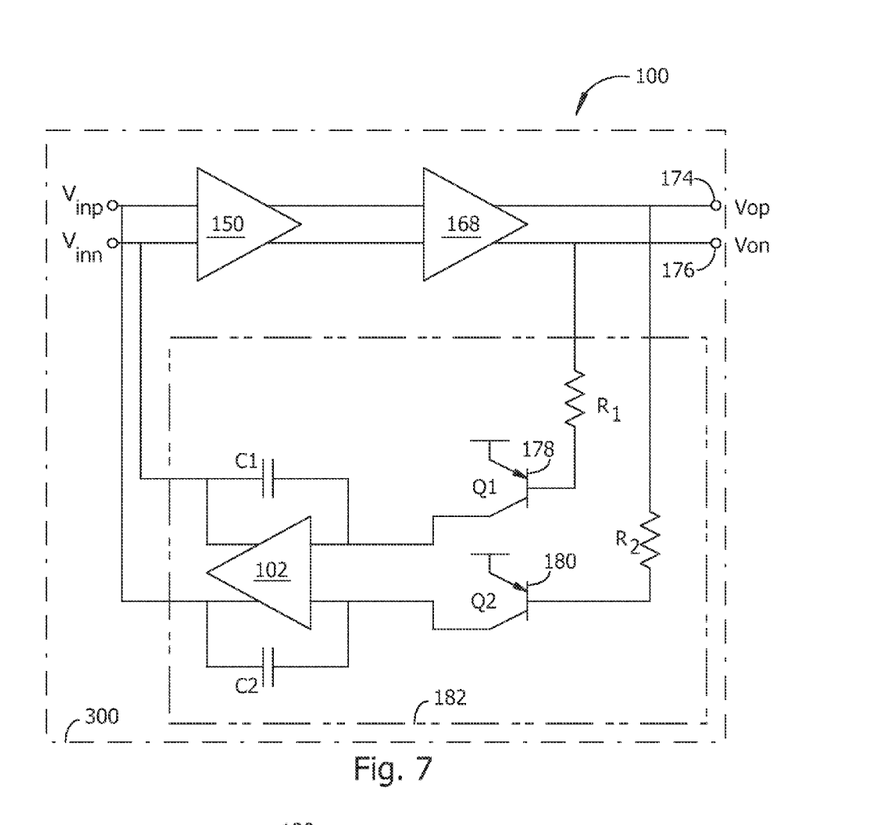
FIG. 7 is a schematic diagram for an alternative embodiment of the invention in which the NPN transistors of FIG. 6 have been replaced with PNP transistors.

FIG. 6 represents an alternative embodiment of the invention in which the circuit in the example of FIGS. 4-5 is modified for differential inputs. In the example of a differential amplifier with output offset cancellation of FIG. 6, the first operational amplifier output 108 of the integrator of FIG. 1 is connected to a negative input voltage terminal Vinn 154 of the first differential amplifier 150. The second operational amplifier output 110 of the integrator is connected to a positive input voltage terminal Vinp 152 of the first differential amplifier 150. FIG. 7 represents an alternative embodiment of a differential amplifier with output offset cancellation in which the NPN resistors Q1 116 and Q2 118 of FIG. 6 are replaced by PNP transistor Q1 178 and PNP transistor Q2 180.

Figure 8:
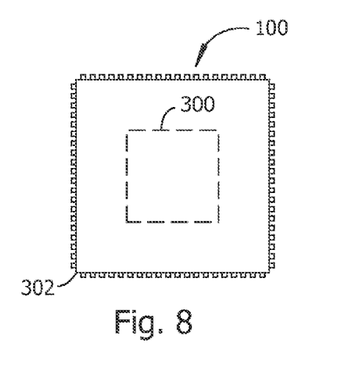
FIG. 8 is a top view of an example of a packaged integrated circuit with a monolithic semiconductor integrated circuit die in accord with an embodiment of the invention.

An example of an integrated circuit in accord with an embodiment of the invention is shown in the top view of FIG. 8. In FIG. 8, a packaged integrated circuit 302 embodiment of the invention 100 includes a monolithic semiconductor die which optionally includes any one or more of the embodiments of the invention shown in FIGS. 1-7. None of the embodiments of the invention disclosed herein require any external components for selecting a response time or a hold time for an integrator. The packaged integrated circuit 302 of FIG. 8 may alternatively be provided in packages having other sizes, shapes, and numbers of terminal pins, including packaged integrated circuits adapted for direct connection of a fiber optic cable.

Figure 9:
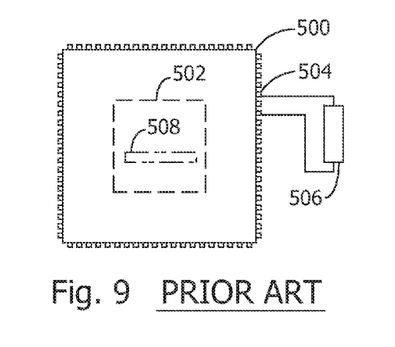
FIG. 9 is a top view of an example of a prior art integrated circuit showing a die with a large area dedicated to a resistor or capacitor for a prior art integrator, and further showing an example of an external component for setting an RC time constant for an RC-based integrator. (PRIOR ART)

FIG. 9 shows an example of an integrated circuit and external components for an RC-based integrator. The RC-based integrator may be fabricated with a packaged integrated circuit 500 having a plurality of terminal pins 504 for making electrical connections to a semiconductor die 502 inside the package. Implementing a relatively large value of an RC time constant in an RC-based integrator may require an undesirably large die area, as represented by a die area 508 that is relatively large compared to the total area of the die 502. Die area 508 may alternately represent either a large-valued and dimensionally large resistor or a large-valued and dimensionally large capacitor, or some other dimensionally large component included on a die for setting an RC time constant in an RC-based integrator. An RC-based integrator may further include an external component 506 electrically coupled to the die 502 to set a desired value for an RC time constant.

Unless expressly stated otherwise herein, ordinary terms have their corresponding ordinary meanings within the respective contexts of their presentations, and ordinary terms of art have their corresponding regular meanings.

What is claimed is:

1. A transimpedance amplifier (TIA), comprising:
    a TIA stage comprising:
        an input;
        an output; and
        a feedback resistor connected from said TIA stage input to said TIA stage output;
    an integrator comprising:
        an operational amplifier having a first input, a second input, a first output, and a second output;
        a first transistor comprising:
            an emitter connected to said operational amplifier first input; and
            a base electrically coupled to said TIA stage output; and
        a second transistor comprising:
            an emitter connected to said operational amplifier second input; and
            a base electrically coupled to said TIA stage input; and
    a voltage controlled current source comprising:
        an offset current line connected to said TIA stage input; and
        a control input line connected to said operational amplifier first output.

2. The TIA of claim 1, further comprising:
    a first resistor connected in series from said first transistor base to said TIA stage output; and
    a second resistor connected in series from said second transistor base to said TIA stage input.

3. The TIA of claim 1, wherein said first and second transistors are bipolar NPN transistors.

4. The TIA of claim 1, wherein said first and second transistors are bipolar PNP transistors.

5. The circuit of claim 1, wherein a response time for the TIA is less than a time duration of a preamble portion of a burst in a burst mode signal and a hold time for the circuit is at least as long as a data portion of the burst.

6. A monolithic semiconductor integrated circuit, comprising:
    an operational amplifier having a first input, a second input, a first output, and a second output;
    a first capacitor connected from said operational amplifier first input to said operational amplifier first output;
    a second capacitor connected from said operational amplifier second input to said operational amplifier second output;
    a first transistor comprising:
        a base; and
        an emitter connected to said operational amplifier first input;
    a second transistor comprising:
        a base; and
        an emitter connected to said operational amplifier second input;
    a TIA stage comprising:
        an input electrically coupled to said second transistor base;
        an output electrically coupled to said first transistor base; and
        a feedback resistor connected from said TIA stage input to said TIA stage output;
    a voltage controlled current source comprising:
        an offset current line connected to said TIA stage input; and
        a control input line connected to said operational amplifier first output.

7. A monolithic semiconductor integrated circuit, comprising:
    an operational amplifier having a first input, a second input, a first output, and a second output;
    a first capacitor connected from said operational amplifier first input to said operational amplifier first output;
    a second capacitor connected from said operational amplifier second input to said operational amplifier second output;
    a first transistor comprising:
        a base; and an emitter connected to said operational amplifier first input;
a second transistor comprising:
a base; and
an emitter connected to said operational amplifier second input;
a first resistor connected in series from said TIA stage output to said first transistor base; and
a second resistor connected in series from said TIA stage input to said second transistor base.

8. A monolithic semiconductor integrated circuit, comprising:
an operational amplifier having a first input, a second input, a first output, and a second output;
a first capacitor connected from said operational amplifier first input to said operational amplifier first output;
a second capacitor connected from said operational amplifier second input to said operational amplifier second output;
a first transistor comprising:
a base; and
an emitter connected to said operational amplifier first input;
a second transistor comprising:
a base; and
an emitter connected to said operational amplifier second input;
a first differential amplifier comprising:
a first differential input;
a second differential input connected to said operational amplifier first output;
a first differential output; and
a second differential output;
a second differential amplifier comprising:
a third differential input connected to said first differential output;
a fourth differential input connected to said second differential output;
a third differential output electrically coupled to said second transistor base; and
a fourth differential output electrically coupled to said first transistor base.

9. The monolithic integrated circuit of claim 8, further comprising:
a first resistor connected in series from said fourth differential output to said first transistor base; and
a second resistor connected in series from said third differential output to said second transistor base.

10. The monolithic integrated circuit of claim 9, wherein said operational amplifier second output is connected to said first differential input.

* * * * *